United States Patent
Friedmann

(12) 
(10) Patent No.: US 6,557,136 B1
(45) Date of Patent: Apr. 29, 2003

(54) METHOD AND SYSTEM FOR LIMITING THE MAXIMUM NUMBER OF CONSECUTIVE ZEROES IN A BLOCK FOR COMMUNICATIONS OR STORAGE

(75) Inventor: Arnon Friedmann, Marlborough, MA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/437,698

(22) Filed: Nov. 10, 1999

(51) Int. Cl.[7] .................... H03M 13/00; G06F 11/00
(52) U.S. Cl. ......................... 714/752; 714/819
(58) Field of Search ..................... 714/752, 755, 714/799, 807, 808, 809; 380/210, 268, 28, 46, 59, 47; 341/94, 59

(56) References Cited

U.S. PATENT DOCUMENTS

| | | | | |
|---|---|---|---|---|
| 4,771,463 A | * | 9/1988 | Beeman | ............... 380/46 |
| 5,283,831 A | * | 2/1994 | Cook et al. | ............... 380/48 |
| 5,351,300 A | * | 9/1994 | Quisquater et al. | ......... 380/46 |
| 6,052,817 A | | 4/2000 | Whaley | ............... 714/769 |
| 6,177,890 B1 | * | 1/2001 | Keirn et al. | ............... 341/59 |
| 6,359,983 B1 | * | 3/2002 | Krone et al. | ......... 379/399.01 |

\* cited by examiner

*Primary Examiner*—Christine T. Tu
(74) *Attorney, Agent, or Firm*—David M. Sigmond

(57) ABSTRACT

A digital encoding subsystem encodes binary input data, which comprises payload data. The subsystem facilitates the preservation of the payload data destined for a temporary holding media, such as a transmission media or a storage media. A scrambler receives and scrambles given binary input data to produce given scrambled data. A criteria checker determines whether the given scrambled data satisfies desired criteria. The criteria may comprise a k-constraint, which represents the maximum number of consecutive zeros in a block of the given scrambled data. A de-scrambler receives and unscrambles the given scrambled data to produce given output data. A scramble modifier may be provided which changes the given scrambled data until the given scrambled data satisfies the desired criteria.

46 Claims, 4 Drawing Sheets

METHOD AND SYSTEM FOR LIMITING THE MAXIMUM NUMBER OF CONSECUTIVE ZEROES IN A BLOCK FOR COMMUNICATIONS OR STORAGE

BACKGROUND OF THE INVENTION

1. Field of the Invention

The present invention relates to transmission and storage systems with certain constraints such as a maximum number of consecutive zeros within a given block that is transmitted or stored.

2. Description of Background Information

Digital magnetic recording systems use run length limited coding to constrain the number of consecutive recorded zeros within given segments of data. A (d,k) code is used; "d" represents the minimum number of consecutive zeros between the 1's, and "k" represents the maximum number of consecutive zeros between the 1's. Conventional recording systems typically use (0,k) constraints, i.e., constraints in which there is no minimum number of zeros between the 1's. The "k" constraint is used for synchronization purposes, e.g., to ensure that the timing of a phase locked loop remains accurate.

FIG. 1 is a block diagram of a digital magnetic recording system 10. Data is stored on a recording medium 18 for later playback. The illustrated digital magnetic recording system 10 comprises an ECC (error correction code) encoder 12. ECC encoder 12 has an output coupled to an input of a (d,k) encoder 14. The output of (d,k) encoder 14 is connected to an input of a precoder 16, the output of which is coupled to a mechanism for recording data onto a recording medium 18. Data played back from recording medium 18 is forwarded to an input of a Viterbi decoder 20, the output of which is connected to an input of a (d,k) decoder 22. The output of (d,k) decoder 22 is connected to an input of an ECC decoder 24. In operation, input data 11 is received at an input of ECC encoder 12, which ECC encodes the input data and forwards the ECC encoded input data to (d,k) encoder 14. The (d,k) encoder 14 further encodes the data to control the (d,k) constraints of the data. The (d,k) constrained data is then input to precoder 16, which precodes the data before it is stored on recording medium 18. When the data is played back from recording medium 18, it is input to viterbi decoder 20, which decodes the data and forwards the decoded data to (d,k) decoder 22, which reverses the encoding performed by (d,k) encoder 14. The (d,k) decoded data is then input to ECC decoder 24, which performs an appropriate ECC decoding operation on the data, and outputs the data at its output 25.

Some digital magnetic recording systems may utilize turbo coding. Such systems split the decoding operation into two steps, and iterate between them. FIG. 2 is a block diagram of a turbo coding digital magnetic recording system 28.

An ECC encoder 29 is provided which has one input and two outputs. Input data 27 is received at its input, the first of its outputs is connected to a multiplex puncture mechanism 30, and a second output is connected to a convolutional encoder 31. Convolutional encoder 31 comprises an output which is coupled to multiplex puncture mechanism 30. Multiplex puncture mechanism 30 comprises an output which is connected to a precoder 32, the output of which is connected to a random permuting operator 34. The output of random permuting operator 34 is connected to a mechanism for placing the data it outputs onto a recording medium 36.

When data is played back from recording medium 36, it is forwarded to an input of an APP channel 40, which forms one element of an iterative decoder 38. Decoder 38 comprises an output which is connected to an input of an ECC decoder 56, which outputs output data 57 at its output. As shown in FIG. 2, iterative decoder 38 comprises a plurality of elements, including a reverse random permuting operator 44, a de-multiplex, de-puncture mechanism 46, an APP convolutional code mechanism 48, a multiplex puncture mechanism 50, and a random permuting operator 54. The illustrated iterative decoder 38 further comprises first and second adders 42 and 52. APP channel 40 comprises two inputs, one of which receives data played back from recording medium 36. It also has an output which is connected directly to first adder 42. The output of first adder 42 is connected to an input of reverse random permuting operator 44, the output of which connects to an input of de-multiplex de-puncture mechanism 46. Mechanism 46 comprises one output which is connected to both APP convolutional code mechanism 48 and an input of second adder 52. APP convolutional code mechanism 48 comprises a first output which is connected to an input of multiplex puncture mechanism 50, the output of which is connected to a second input of second adder 52. The output of second adder 52 is connected to the input of random permuting operator 54. The output of random permuting operator 54 is connected to a second input of first adder 42 and is further connected to the second input of APP channel 40.

There is a need for alternate/improved methods for limiting the number of consecutive zeros within a block of information to be stored or transmitted in transmission and storage systems, e.g., in a digital magnetic recording system such as that shown in FIG. 1. Moreover, there is a need for a method or system which will allow (d,k) encoding methods to be applied to turbo coding systems, such as in the system illustrated in FIG. 2.

SUMMARY OF THE INVENTION

The present invention is presented to bring about one or more advantages, such as those noted below. One object of the present invention is to provide an alternate, improved method and system for encoding and decoding binary data so as to limit the number of consecutive zeros within a given block of such data, as the data is forwarded to a temporary holding media, such as a transmission media or storage media. A further object of the present invention is to provide a (d,k) coding system which is applicable to newer proposed magnetic recording systems using turbo codes. Another object of the present invention is to provide a coding method and system which will use little overhead in its operation.

The present invention, therefore, is directed to a method or system, or one or more components thereof, for encoding binary input data comprising payload data to facilitate the preservation of the payload data destined for a temporary holding media, such as transmission media or storage media. A scrambler receives and scrambles given binary input data to produce given scrambled data. A de-scrambler receives and unscrambles the given scrambled data to produce given output data. The given scrambled data may be written in the form of media data onto storage media, or it may be transmitted in the form of media data over transmission media. The de-scrambler receives and unscrambles the given scramble data from the media data which is recovered from the storage media or the transmission media.

A criteria checker may be provided for determining whether the given scrambled data satisfies desired criteria.

The desired criteria may be a k constraint, which represents the maximum number of consecutive zeros allowed within the given scrambled data. In a particular embodiment, the given scrambled data comprises a block of data of a predetermined size. A scramble modifier changes the given scrambled data until it satisfies the desired criteria. The temporary holding media may comprise a storage media, and may more specifically comprise a magnetic recording disk. In a specific embodiment, the magnetic recording disk comprises a turbo coded magnetic recording disk.

The scrambler, in a particular aspect of the present invention, comprises a pseudo-random scrambler. The pseudo-random scrambler may comprise a set of pseudo-random sequences and a mechanism for XORing a given pseudo-random binary sequence from the set with the given binary input data to produce the given scrambled data. The scramble modifier may comprise a mechanism for causing the scrambler to re-scramble the given binary input data using a different pseudo-random sequence from the set of pseudo-random sequences. The de-scrambler reverses the operation performed by the scrambler to reverse any scrambling of the given binary input data.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout the several views, and wherein.

DETAILED DESCRIPTION OF THE EXEMPLARY EMBODIMENTS

Figure 1:
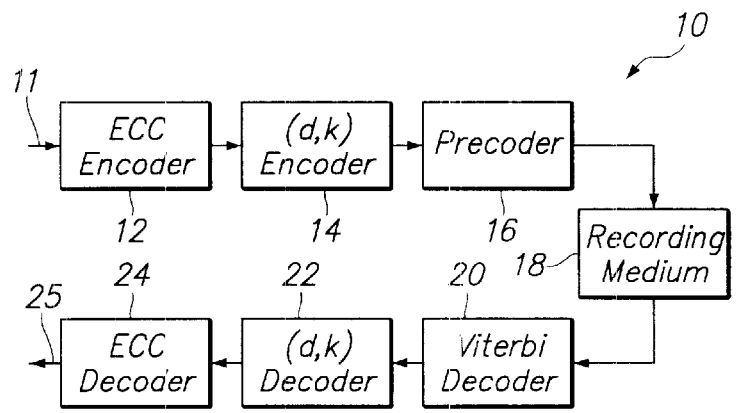
FIG. 1 is a diagram of a conventional digital magnetic recording system.
Figure 2:
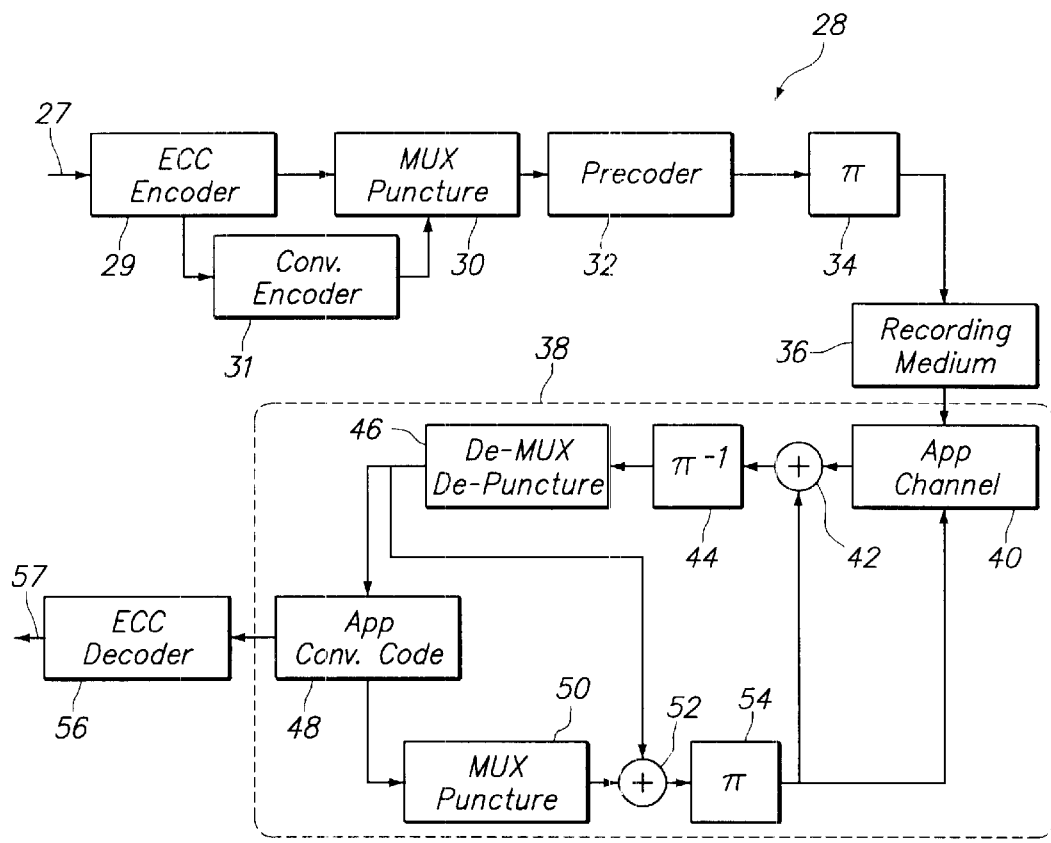
FIG. 2 is a block diagram of a conventional turbo coding system.
Figure 3:
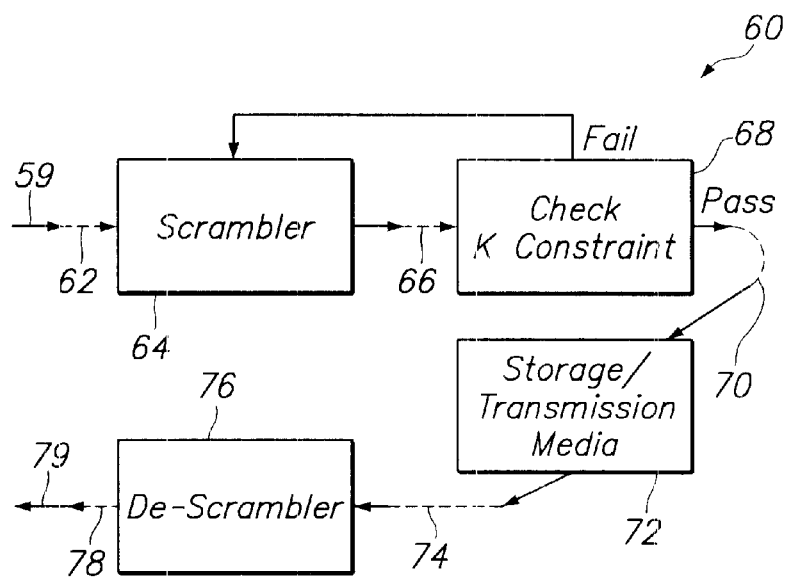
FIG. 3 is a block diagram of a digital data transmission or storage system in accordance with one embodiment of the present invention.

Referring now to the drawings in greater detail, FIG. 3 is a detailed block diagram of a digital data transmission or storage system 60. The illustrated system 60 comprises a scrambler 64, a k-constraint checker 68, storage/transmission media 72 and a de-scrambler 76. Input data 59 is coupled to an input of scrambler 64 via a first data path 62. Scrambler 64 comprises an output which is coupled to an input of k-constraint checker 68 via a second data path 66. K-constraint checker comprises two outputs: a pass output and a fail output. The fail output of k-constraint checker 68 is connected to a second input of scrambler 64. The pass output of k-constraint checker 68 is connected to an input of storage/transmission media 72 via a third data path 70. Data output from storage/transmission media 72 is forwarded to an input of de-scrambler 76 via a fourth data path 74. Output data 79 is received from the output of de-scrambler 76 via a fifth data path 78. Each of first data path 62, second data path 66, third data path 70, fourth data path 74, and fifth data path 78 may comprise one or more circuit components, including, for example, signal processing devices such as encoders and decoders.

The illustrated digital data transmission/storage system 60 comprises mechanisms for encoding the input data 59, which comprises, binary input data including payload data. The elements provided in the system illustrated in FIG. 3 facilitate the preservation of the payload data destined for a temporary holding media, which comprises either a storage or a transmission media 72. Storage/transmission media 72 may comprise a magnetic recording disk, and more specifically, may comprise a turbo-coded magnetic recording disk. Scrambler 64 receives and scrambles given binary input data to produce given scrambled data at its output. In the illustrated embodiment, the given binary input data is sequential data, which is arranged in the form of blocks. The length of each block may be the same. For example, a given block may be 512 bytes (equal to 4096 bits), or for example, a block may be 4096 bytes in length. The scrambled data is also arranged in sequential form comprising equal sized blocks of the same length.

K-constraint checker 68 determines whether the given scrambled status satisfies desired criteria. In the illustrated embodiment, the desired criteria comprises a k-constraint, where a k-constraint equals a maximum number of consecutive zeros present in the given scrambled data.

De-scrambler 76 receives and unscrambles the given scrambled data to produce given output data 79.

Scrambler 64 and de-scrambler 76 may comprise mechanisms which utilize pseudo-random sequences for scrambling and de-scrambling, respectively. Further information regarding the structure of the scrambler and the de-scrambler is provided below, with respect to certain specific embodiments illustrated herein.

In the embodiment illustrated in FIG. 3, the scrambling performed by scrambler 64 is modified when k-constraint checker 68 determines that the given scrambled data does not satisfy the desired criteria. Specifically, a signal is output at the fail output of k-constraint checker 68, and that fail signal is input to scrambler 64. When scrambler 64 receives the fail signal, it modifies the given scrambled data to produce modified given scrambled data until the given scrambled data satisfies the desired criteria, as again determined by k-constraint checker 68.

Specifically, in accordance with the illustrated embodiment, scrambler 64 will use a different pseudo-random sequence from among a set of pseudo-random sequences to scramble the given data.

Figure 4:
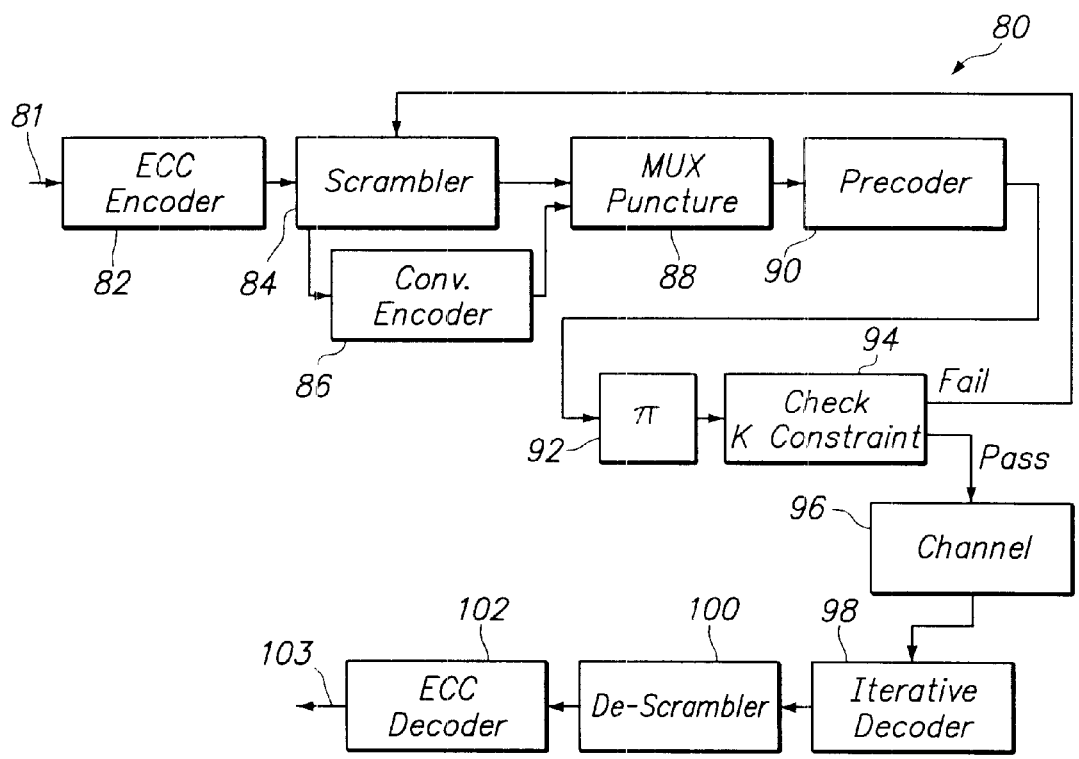
FIG. 4 is a block diagram of a turbo coding system in accordance with another embodiment of the present invention.

FIG. 4 illustrates a turbo-coding system 80. The illustrated turbo-coding 80 comprises an ECC encoder 82, a scrambler 84, a convolutional encoder 86, a multiplex puncture mechanism 88, a precoder 90, a random permuting operator 92, a k-constraint checker 94, a channel 96, an iterative decoder 98, a de-scrambler 100 and an ECC decoder 102. Input data 81 is received at an input of ECC encoder 82. The output of ECC encoder 82 is forwarded to an input of scrambler 84. Scrambler 84 comprises two outputs. One output of scrambler 84 is forwarded to an input of multiplex puncture mechanism 88. The other output of scrambler 84 is forwarded to an input of convolutional encoder 86. The output of convolutional encoder 86 is also input to multiplex puncture mechanism 88. Multiplex puncture mechanism 88 comprises an output which is forwarded to an input of precoder 90. Precoder 90 has an output that is input to the input of random permuting operator 92. Random permuting operator 92 has an output which is input to k-constraint checker 94. K-constraint checker 94 comprises a fail output and pass output. The fail output is forwarded to a fail signal receiving input of scrambler 84. The pass output is forwarded to channel 96. Information output from channel 96 is forwarded to an input of iterative decoder 98. The output of iterative decoder 98 is forwarded to an input of de-scrambler 100. The output of de-scrambler 100 is connective to the input of ECC decoder 102. ECC decoder 102 outputs data 103.

The system illustrated in FIG. 4 is provided with the necessary structure to facilitate the preservation of the payload data destined for channel 96, while making sure that the data satisfies certain desired criteria. Specifically, the data satisfies a k-constraint per the k-constraint checker 94. Accordingly, scrambler 84, k-constraint checker 94 and de-scrambler 100 may be implemented in the same manner as described above with respect to the corresponding elements shown in FIG. 3.

Figure 5:
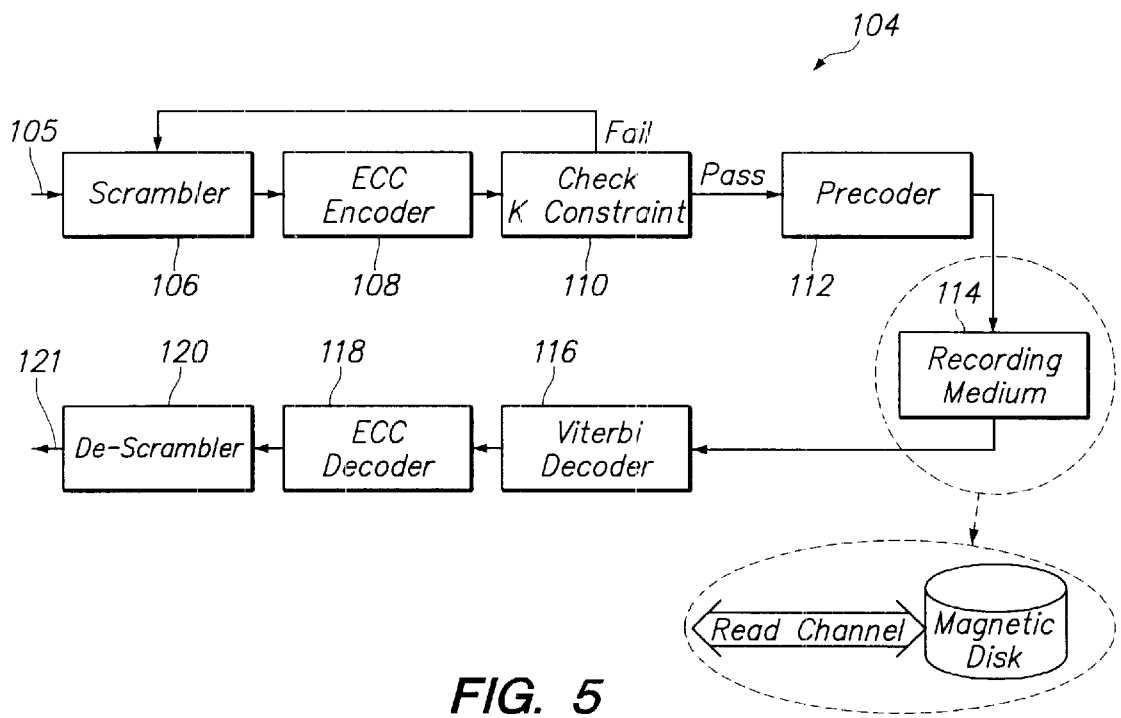
FIG. 5 is a block diagram of a digital magnetic recording system in accordance with another embodiment of the present invention.

FIG. 5 is a block diagram of a digital magnetic recording system. This illustrated system comprises a scrambler 106, an ECC encoder 108, a k-constraint checker 110, a precoder 112, a recording medium 114, a Viterbi decoder 116, an ECC decoder 118 and a de-scrambler 120. Input data 105 is received at an input of scrambler 106. The output of scrambler 106 is coupled to an input of ECC encoder 108. The output of ECC encoder is connected to the input of k-constraint checker 110. K-constraint checker 110 comprises a pass output and a fail output. The pass output is forwarded to the input of precoder 112. The fail output is connected to a second input of scrambler 106. Data output by precoder 112 is forwarded to recording medium 114. Data that is played back from recording medium 114 is forwarded to an input of Viterbi decoder 116. The output of Viterbi decoder 116 is coupled to the input of the ECC decoder 118. The output of ECC decoder 118 is coupled to the de-scrambler 120. Output data 121 is output by de-scrambler 120. As illustrated, recording medium 114 may comprise a magnetic recording disk (e.g., a computer hard disk) accessible via a read channel for writing to and reading from the magnetic recording disk.

The system illustrated in FIG. 5 demonstrates that an ECC encoder 108 may be placed after scrambler 106. This allows a mechanism to be provided, such as ECC encoder 108, which checks the validity of the data produced by scrambler 106. Accordingly, an ECC decoder 118 is provided before de-scrambler 120. Each of the scrambler 106, k-constraint checker 110, and de-scrambler 120 may be implemented in the same manner as described above with respect to the system shown in FIG. 3. Providing the scrambler outside of the ECC, as illustrated in FIG. 5, increases the accuracy with which the scrambling pattern used by the scrambler can be identified by the de-scrambler. Overhead will be reduced— on the order of one to two percent, there will be no error propagation, and there is no need for using a separate clock for decoding the (d,k) code. This may occur as bits coming out of a Viterbi detector are decoded before being passed to the ECC decoder.

Figure 6:
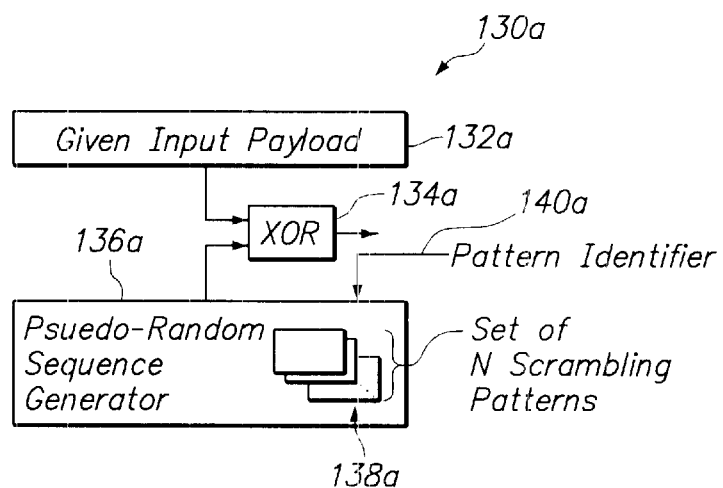
FIG. 6 is a block diagram of a scrambler.
Figure 7:
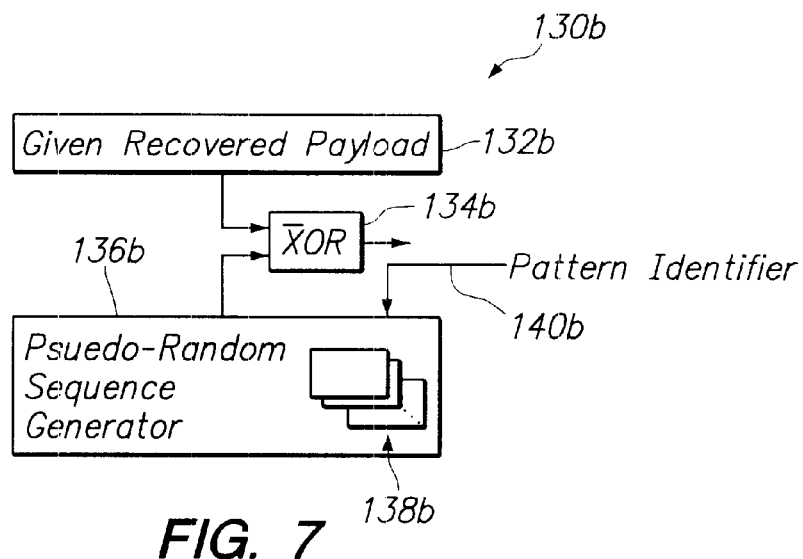
FIG. 7 is a block diagram of a de-scrambler.

FIGS. 6 and 7 are block diagrams showing specific implementations of a scrambler and de-scrambler, respectively. In FIG. 6, scrambler 130a comprises a demultiplexing mechanism, not shown, for separating certain overhead information (including a pattern identifier representing the desired scrambling pattern) and payload data from the signal which is received by scrambler 130a. The separated given input payload 132a is input to one input of an XOR device/circuit 134a. A pseudo-random sequence generator 136a is provided, which generates a pseudo-random sequence which has a length equal to the block size of the payload data. That sequence is input to the second input of XOR circuit 134a. Pseudo-random sequence generator 136a has an input for receiving a pattern identifier 140a, and comprises a set of N scrambling patterns 138a. In accordance with the pattern identified by the pattern identifier 140a input to pseudo-random sequence generator 136a, the appropriate scrambling pattern is output.

The scrambling patterns may be implemented with the use of a feedback shift register comprising certain initial values and feedback settings that can be modified to select among a given set of scrambling patterns formed by the feedback shift register.

A de-scrambler 130b, as shown in FIG. 7, may be implemented so as to be identical to scrambler 130a as shown in FIG. 6. Accordingly, a de-scrambler 130b may comprise a mechanism for demultiplexing the signal it receives to separate out payload and overhead information. Given recovered payload 132b is connected to the first input of an XOR circuit 134b. A pseudo-random sequence generator 136b is provided, which outputs a pseudo-random sequence to the second input of XOR circuit 134b. Each pseudo-random sequence is equal in length to the length of a block of the payload data. A set of N scrambling patterns 138b may be chosen in accordance with a pattern identifier 140b input to pseudo-random sequence generator 136b.

Figure 8:
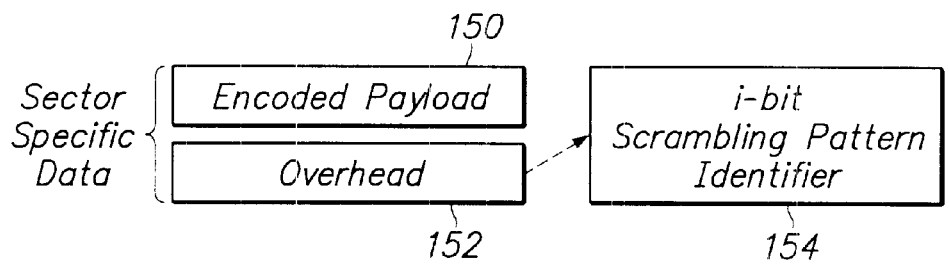
FIG. 8 is a schematic diagram representing sector-specific data.

FIG. 8 is a schematic diagram illustrating the basic components of data specific to a given sector or block. That data comprises encoded payload data 150 and overhead data 152. Overhead data 152 may comprise an i-bit scrambling pattern identifier 154.

In the event the scrambling pattern identifier is represented with i-bits, the total number of possible scrambling patterns would be equal to $2^i$. Accordingly, if the total number of scrambling patterns which may be chosen from is 16, the i-bit scrambling pattern identifier may be represented with i=4 bits. In such a case, k may be as low as 24. With these parameters, the probability of there being a violation of the k-constraint equal to 24 is less than $10^{-60}$ (for a block of 512 bytes).

Using a pseudo-random scrambler and a de-scrambler ensures that the k-constraint is followed to a certain degree of confidence. Given a random block of length N, the probability of having a run of length L zeros or more is given by:

$$P=(N-L+1)/2^{L+1}$$

A typical k-constraint used in high-rate systems today is on the order of 15. Accordingly, k-constraints from 20 to the mid-20's may not be unreasonable. For example, with a current sector size of 512 bytes (4096 bits), the probability of there being a run of 24 zeros or more in one sector is 1.2 e-4. This may not be an acceptable level of comfort, since one in every ten thousand blocks may violate the k-constraint.

Accordingly, in the illustrated embodiments, a k-constraint check mechanism 68 is provided. This takes into account the fact that given that the probability of one random block violating the constraint is P, the probability that m consecutive blocks violate the constraint is $\sim P^m$. Accordingly, instead of using a single scrambling sequence, one may choose from among m scrambling sequences in order to reduce the probability of violating the constraint to an arbitrary low value.

While the invention has been described by way of example embodiments, it is understood that the words that have been used herein are words of description, rather than words of limitation. Changes may be made, within the purview of the appended claims, without departing from the spirit and scope of the invention in its broader aspects. Although the invention has been described herein with reference to particular mechanisms, materials, and embodiments, it is understood that the invention is not so limited. The invention extends to all equivalent structures, mechanisms, acts and uses, which are within the scope of the appended claims.

What is claimed is:

1. A digital encoding subsystem for encoding binary input data comprising payload data to facilitate the preservation of the payload data destined for a temporary holding media, said subsystem comprising:
   a scrambler for receiving and scrambling given binary input data to produce given scrambled data, wherein said scrambler scrambles said binary input data if said scrambled data does not satisfy a maximum number of consecutive zeros in a run length limited code;
   a temporary holding media for holding said given scrambled data; and
   a de-scrambler for receiving and de-scrambling said given scrambled data to produce given output data.

2. The subsystem according to claim 1, wherein said temporary holding media comprises transmission media.

3. The subsystem according to claim 1, wherein said temporary holding media comprises storage media.

4. The subsystem according to claim 3, wherein said storage media comprises a magnetic recording disk.

5. The subsystem according to claim 4, wherein said magnetic recording disk comprises a turbo-coded magnetic recording disk.

6. The subsystem according to claim 3, wherein said storage media comprises a magnetic tape.

7. The subsystem according to claim 3, wherein said storage media comprises an optical recording medium.

8. The subsystem according to claim 3, further comprising a write mechanism for writing given media data comprising said given scrambled data to said storage media.

9. The subsystem according to claim 8, further comprising a read mechanism for reading said given media data from said storage media.

10. The subsystem according to claim 9, wherein said write mechanism and said read mechanism collectively comprise a read channel of a hard disk device, and wherein said storage media comprises a magnetic hard disk.

11. The subsystem according to claim 9, wherein said write mechanism and said read mechanism collectively comprise a read channel of a magnetic tape device, and wherein said storage media comprises a magnetic tape.

12. The subsystem according to claim 9, wherein said write mechanism and said read mechanism collectively comprise a read channel of an optical reading device, and wherein said storage media comprises an optical recording medium.

13. The subsystem according to claim 1, wherein said scrambler comprises a pseudo-random scrambler.

14. The subsystem according to claim 13, wherein said scrambler comprises a set of pseudo-random sequences and a mechanism for XORing a given pseudo-random sequence with said binary input data.

15. The subsystem according to claim 14, wherein said de-scrambler comprises a mechanism for XORing said given scrambled data with the same given pseudo-random sequence to reverse a scrambling of said given binary input data.

16. The subsystem according to claim 1, wherein said given binary input data comprises blocks, each block having a predetermined length.

17. The subsystem according to claim 16, wherein said block is 512 bytes in length.

18. The subsystem according to claim 16, wherein said block is 4096 bytes in length.

19. The subsystem according to claim 16, wherein, said given scrambled data comprises blocks having a length equal to the same length of the blocks of said given binary input data.

20. The subsystem according to claim 1, further comprising a criteria checker for determining whether said given scrambled data satisfies desired criteria.

21. The subsystem according to claim 20, wherein said criteria checker comprises a mechanism for causing said scrambler to rescramble said given binary input data using a different pseudo-random sequence from a set of pseudo-random sequences.

22. The subsystem according to claim 20, wherein said criteria checker comprises a k-constraint criteria checker.

23. The subsystem according to claim 22, wherein said k-constraint criteria checker determines whether said given scrambled data satisfies a desired k-constraint, said desired k-constraint comprising a maximum number of consecutive zeros in one block of said given scrambled data.

24. A digital encoding subsystem for encoding binary input data comprising payload data to facilitate the preservation of the payload data destined for a temporary holding media, said subsystem comprising:
   a scrambler for receiving and scrambling given binary input data to produce given scrambled data, wherein said scrambler rescrambles said binary input data if said scrambled data does not satisfy a desired criteria;
   a temporary holding media for holding said given scrambled data; and
   a de-scrambler for receiving and de-scrambling said given scrambled data to produce given output data.

25. The subsystem according to claim 24, wherein said temporary holding media comprises transmission media.

26. The subsystem according to claim 24, wherein said temporary holding media comprises storage media.

27. The subsystem according to claim 26, wherein said storage media comprises a magnetic recording disk.

28. The subsystem according to claim 27, wherein said magnetic recording disk comprises a turbo-coded magnetic recording disk.

29. The subsystem according to claim 26, wherein said storage media comprises a magnetic tape.

30. The subsystem according to claim 26, wherein said storage media comprises an optical recording medium.

31. The subsystem according to claim 26, further comprising a write mechanism for writing given media data comprising said given scrambled data to said storage media.

32. The subsystem according to claim 31, further comprising a read mechanism for reading said given media data from said storage media.

33. The subsystem according to claim 32, wherein said write mechanism and said read mechanism collectively comprise a read channel of a hard disk device, and wherein said storage media comprises a magnetic hard disk.

34. The subsystem according to claim 32, wherein said write mechanism and said read mechanism collectively comprise a read channel of a magnetic tape device, and wherein said storage media comprises a magnetic tape.

35. The subsystem according to claim 32, wherein said write mechanism and said read mechanism collectively comprise a read channel of an optical reading device, and wherein said storage media comprises an optical recording medium.

36. The subsystem according to claim 24, wherein said scrambler comprises a pseudo-random scrambler.

37. The subsystem according to claim 36, wherein said scrambler comprises a set of pseudo-random sequences and a mechanism for XORing a given pseudo-random sequence with said binary input data.

38. The subsystem according to claim 37, wherein said de-scrambler comprises a mechanism for XORing said given scrambled data with the same given pseudo-random sequence to reverse a scrambling of said given binary input data.

39. The subsystem according to claim 24, wherein said given binary input data comprises blocks, each block having a predetermined length.

40. The subsystem according to claim 39, wherein said block is 512 bytes in length.

41. The subsystem according to claim 39, wherein said block is 4096 bytes in length.

42. The subsystem according to claim 39, wherein said given scrambled data comprises blocks having a length equal to the same length of the blocks of said given binary input data.

43. The subsystem according to claim 24, further comprising a criteria checker for determining whether said given scrambled data satisfies said desired criteria.

44. The subsystem according to claim 43, wherein said criteria checker comprises a mechanism for causing said scrambler to rescramble said given binary input data using a different pseudo-random sequence from a set of pseudo-random sequences.

45. The subsystem according to claim 43, wherein said criteria checker comprises a k-constraint checker.

46. The subsystem according to claim 45, wherein said k-constraint criteria checker determines whether said given scrambled data satisfies a desired k-constraint, said desired k-constraint comprising a maximum number of consecutive zeros in one block of said given scrambled data.

* * * * *